United States Patent
Ament et al.

(10) Patent No.: US 10,627,217 B2
(45) Date of Patent: Apr. 21, 2020

(54) METHOD FOR DETERMINING THE THICKNESS OF A CONTAMINATING LAYER AND/OR THE TYPE OF CONTAMINATING MATERIAL, OPTICAL ELEMENT AND EUV-LITHOGRAPHY SYSTEM

(71) Applicant: Carl Zeiss SMT GmbH, Oberkochen (DE)

(72) Inventors: Irene Ament, Aalen (DE); Moritz Becker, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 15/485,870

(22) Filed: Apr. 12, 2017

(65) Prior Publication Data
US 2017/0292830 A1    Oct. 12, 2017

(30) Foreign Application Priority Data
Apr. 12, 2016    (DE) .................. 10 2016 206 088

(51) Int. Cl.
*G01J 1/42*    (2006.01)
*G01N 21/41*    (2006.01)
(Continued)

(52) U.S. Cl.
CPC .......... *G01B 11/0616* (2013.01); *B82Y 10/00* (2013.01); *G01J 1/0238* (2013.01);
(Continued)

(58) Field of Classification Search
CPC ..... G01J 1/429; G01J 1/0238; G01B 11/0616; G01B 11/06; G01N 21/94; G21K 1/062; B82Y 10/00; G03F 7/20
See application file for complete search history.

(56) References Cited

U.S. PATENT DOCUMENTS

| 7,993,464 B2 * | 8/2011 | LeClaire | ............... B08B 7/0042 |
| | | | 134/1 |
| 2007/0139646 A1 | 6/2007 | Singh | |

(Continued)

FOREIGN PATENT DOCUMENTS

| DE | 102007037201 A1 | 2/2009 |
| WO | 2005091076 A2 | 9/2005 |
| WO | 2014114382 A1 | 7/2014 |

OTHER PUBLICATIONS

Office Action in corresponding German Application 102016206088.0, dated Apr. 12, 2016, along with English Translation.
(Continued)

*Primary Examiner* — Sang H Nguyen
(74) *Attorney, Agent, or Firm* — Edell, Shapiro & Finnan, LLC (57) ABSTRACT

The invention relates to a method for determining the thickness of a contaminating layer and/or the type of a contaminating material on a surface (7) in an optical system, in particular on a surface (7) in an EUV lithography system, comprising: irradiating the surface (7) on which plasmonic nanoparticles (8a,b) are formed with measurement radiation (10), detecting the measurement radiation (10a) scattered at the plasmonic nanoparticles (8a,b), and determining the thickness of the contaminating layer and/or the type of the contaminating material on the basis of the detected measurement radiation (10a). The invention also relates to an optical element (1) for reflecting EUV radiation (4), and to an EUV lithography system.

14 Claims, 2 Drawing Sheets

(51) Int. Cl.
   *G01N 21/94* (2006.01)
   *G01J 1/02* (2006.01)
   *G01B 11/06* (2006.01)
   *G01N 21/552* (2014.01)
   *G03F 7/20* (2006.01)
   *B82Y 10/00* (2011.01)
   *G21K 1/06* (2006.01)
   *G01N 21/95* (2006.01)
   *G01N 21/47* (2006.01)

(52) U.S. Cl.
   CPC .............. *G01J 1/429* (2013.01); *G01N 21/41* (2013.01); *G01N 21/554* (2013.01); *G01N 21/94* (2013.01); *G03F 7/7085* (2013.01); *G03F 7/70591* (2013.01); *G03F 7/70916* (2013.01); *G03F 7/70958* (2013.01); *G21K 1/062* (2013.01); *G01N 21/4785* (2013.01); *G01N 2021/9511* (2013.01)

(56) References Cited

U.S. PATENT DOCUMENTS

| | | | | |
|---|---|---|---|---|
| 2012/0089180 A1* | 4/2012 | Fathi | ............... | B41J 2/17559 606/214 |
| 2013/0115710 A1* | 5/2013 | Geddes | ............... | C09K 11/025 436/172 |
| 2014/0104606 A1* | 4/2014 | Shih | ............... | G01N 21/658 356/301 |
| 2014/0226195 A1* | 8/2014 | Elsayad | ............... | G01N 21/6458 359/241 |
| 2014/0256593 A1* | 9/2014 | Szmacinski | ............... | C12Q 1/02 506/9 |
| 2015/0355040 A1* | 12/2015 | Sirbuly | ............... | G01L 1/242 356/73.1 |
| 2015/0362500 A1* | 12/2015 | Anker | ............... | A61K 49/0423 424/9.42 |
| 2016/0025554 A1* | 1/2016 | Gerhard | ............... | G01B 11/0616 355/67 |
| 2016/0178516 A1* | 6/2016 | Abdulhalim | ............... | G01N 29/022 356/364 |

OTHER PUBLICATIONS

K.A. Willets, R.P. Van Duyne, "Localized Surface Plasmon Resonance Spectroscopy and Sensing. In: Annu. Rev. Phys. Chem.", vol. 58, 2007, pp. 267-297.

Ament et al., "Single Unlabeled Protein Detection on Individuals Plasmonic Nanoparticles", ACS Publications, Nano Letters, Mainz, Germany, 4 pages.

* cited by examiner

METHOD FOR DETERMINING THE THICKNESS OF A CONTAMINATING LAYER AND/OR THE TYPE OF CONTAMINATING MATERIAL, OPTICAL ELEMENT AND EUV-LITHOGRAPHY SYSTEM

BACKGROUND OF THE INVENTION

The invention relates to a method for determining the thickness of a contaminating layer and/or the type of a (at least one) contaminating material on a surface in an optical system, in particular on a surface in an EUV lithography system, to an optical element for reflecting EUV radiation, and to an EUV lithography system.

Contaminating materials may deposit on the surfaces of optical or non-optical elements arranged in an optical system, which materials may grow over the course of time to form a contaminating layer. One example of such an optical system is an EUV lithography apparatus in which EUV radiation-reflecting optical elements and non-optical components are arranged in a vacuum environment in a residual gas atmosphere in which the occurrence of contaminating gaseous substances cannot be completely avoided. Other examples of optical systems in which a contaminating layer may form are inspection or metrology systems for optical elements, for example for wafers or for masks. Such contaminating layers may also form in optical systems which use radiation at other wavelengths as used radiation, for example radiation in the DUV wavelength range. One example of such an optical system is a DUV lithography apparatus.

Information about the thickness of such a contaminating layer and the type of the contaminating materials forming the contaminating layer may be advantageous for cleaning purposes: by way of example, a respective surface may be cleaned if the thickness of the contaminating layer exceeds a predefined value, and/or the type of cleaning, for example the reagent used for the cleaning, for example a cleaning gas, may be chosen suitably, if appropriate, depending on the type of the contaminating material.

WO 2014/114382 A1 has disclosed a method for determining the phase angle at a free interface of an optical element provided with an EUV radiation-reflecting multilayer coating and/or for determining the thickness of a contaminating layer formed on the multilayer coating. In the method, a photocurrent generated when the multilayer coating is irradiated with EUV radiation is measured and the thickness of the contaminating layer is determined on the basis of a predefined relationship between the measured photocurrent and the thickness of the contaminating layer.

WO 2005/091076 A2 describes a method for determining the thickness of a capping layer of a multilayer coating on the basis of a phase shift of a standing electromagnetic wave. The phase shift of the standing wave is likewise measured with the aid of a photocurrent.

Besides the methods described above, the thickness of a contaminating layer may, if appropriate, also be determined by means of a measurement based on ellipsometry. However, a defined geometry between the source of the measurement radiation and the detector is necessary in this case, such that there is very high complexity involved in performing a (scanning) measurement on an optical element in the form of a mirror or on a plurality of facets of a facet mirror and in determining the thickness of the contaminating layer in this way.

OBJECT OF THE INVENTION

It is an object of the invention to provide a method of the type mentioned in the introduction, an optical element and an EUV lithography system in which the thickness of a contaminating layer and/or the type of a contaminating material on a surface in an optical system, in particular during the operation of the optical system, can be determined in a simple manner.

SUBJECT MATTER OF THE INVENTION

This object is achieved by means of a method of the type mentioned in the introduction which comprises the following steps: irradiating the surface on which plasmonic nanoparticles are formed with measurement radiation, detecting the measurement radiation scattered at the plasmonic nanoparticles, and determining the thickness of the contaminating layer and/or the type of the contaminating material on the basis of the detected measurement radiation scattered at the plasmonic nanoparticles.

In contrast to a layer thickness measurement based on ellipsometry, the measurement radiation scattered at the plasmonic nanoparticles is detected rather than the measurement radiation reflected at the surface. The measurement according to the invention therefore does not require an accurately defined geometry or alignment of the measurement light source and the detector relative to the surface, such that the contamination measurement can be carried out with considerably less complexity.

The surface on which the thickness of the contaminating layer and/or the type of the contaminating material are/is determined may be the surface of an optical element or of a non-optical element or component which is arranged in an optical system. The optical system may be in particular an EUV lithography system, i.e. a system which is used for lithography at wavelengths in the EUV wavelength range, i.e. between approximately 5 nm and approximately 30 nm. The EUV lithography system may be for example an EUV lithography apparatus, an EUV mask metrology system, a wafer metrology system or generally a metrology system for optical elements. The optical system may also be an optical system which is not operated with radiation in the EUV wavelength range, for example a DUV lithography apparatus.

In order to determine the layer thickness and/or the type of the contaminating material, the invention proposes providing or forming plasmonic nanoparticles on the (not yet contaminated) surface. The plasmonic nanoparticles may be formed from a metallic material, for example from gold, silver or possibly copper, since the plasmon bands thereof lie in the visible spectral range, such that these can be excited with measurement radiation at wavelengths in the visible wavelength range. However, other, typically metallic materials such as e.g. platinum may also be applied in the form of plasmonic nanoparticles on the surface.

Measurement radiation whose wavelength lies in the wavelength range of the absorption band of the corresponding material of the plasmonic nanoparticle can excite plasmonic nanoparticles to carry out collective oscillations, which are referred to as plasmons. The plasmons lead to high local field strength at the nanoparticles.

Advances in nanotechnology have had the effect that metallic structures even of the order of magnitude of nanometres can be produced and manipulated in a controlled manner, as a result of which new applications have become possible which make use of the effect of localized surface plasmon resonance, cf. the article "Localized Surface Plasmon Resonance Spectroscopy and Sensing", K. A. Willets and R. P. van Duyne, Annu. Rev. Phys. Chem. 2007, 58, pages 267-297. With the aid of individual plasmonic nanoparticles, it is possible to detect even individual molecules on a surface, cf. for example the article "Single Unlabeled Protein Detection on Individual Plasmonic Nanoparticles", by I. Ament et al., Nano Lett., 2012, 12 (2), pages 1092-1095.

The measurement radiation scattered at an individual plasmonic nanoparticle has a wavelength-dependent or spectral scattered light intensity which is maximal at a maximum wavelength $\lambda_{Max}$ (resonance wavelength) and decreases exponentially, for example, around said maximum wavelength. As is described in the first of the articles cited further above, a change in the local environment of the nanoparticle, for example the presence of an adsorbed substance, leads to a shift $\Delta\lambda_{Max}$ in the maximum wavelength $\lambda_{Max}$, which can be described approximately by the following formula:

$$\Delta\lambda_{Max}=m\Delta n[1-\exp(-2d/l_d)],$$

wherein m denotes the refractive index response of the nanoparticles, $\Delta n$ denotes the change in refractive index produced by the adsorbate (or the layer), d denotes the effective layer thickness of the adsorbate (or the layer) and $l_d$ denotes the characteristic decay length of the electromagnetic field. A rise in the refractive index n in the surroundings of the nanoparticle leads, according to the above formula, to a shift in the maximum wavelength $\lambda_{Max}$ to higher wavelengths, i.e. to a red shift.

In one variant of the method, a wavelength shift of a spectral distribution of the measurement radiation scattered at the plasmonic nanoparticles is determined for the purpose of determining the thickness of the contaminating layer. As was described further above, there is a relationship between the spectral distribution of the scattered light intensity of the measurement radiation scattered at the plasmonic nanoparticles and the thickness of a layer situated on the nanoparticle or surrounding the latter, such that the thickness of the contaminating layer can be deduced on the basis of the wavelength shift of the spectral distribution of the scattered light intensity, in particular on the basis of the shift in the maximum wavelength of the spectral distribution of the scattered light intensity of the detected measurement radiation. It goes without saying that in particular a change in the thickness of the contaminating layer over time can also be determined (if appropriate continuously) in this way, that is to say that both an increase in the thickness of the contaminating layer and a decrease in the thickness of the contaminating layer—for example on account of an etching or cleaning process—can be determined.

In a further variant, wavelength shifts of a plurality of spectral distributions of the measurement radiation scattered at plasmonic nanoparticles having in each case at least one different property are determined for the purpose of determining the type of the contaminating material. Since the wavelength shift $\Delta\lambda_{Max}$ of the maximum wavelength $\lambda_{Max}$ or the wavelength shift of the spectral distribution is dependent on the refractive index n or on the change $\Delta n$ in refractive index produced by the material present in the surroundings of the plasmonic nanoparticle, typically it is also possible to determine the type of the contaminated material of the layer on the basis of the measurement radiation scattered at the plasmonic nanoparticles:

The form and typically also the maximum wavelength of the spectral distribution of the detected measurement radiation depends on the properties of the respective plasmonic nanoparticle at which said radiation is scattered. In particular, the extent of the shift in the spectral distribution, depending on the material of the contaminating layer, has different magnitudes for nanoparticles having different properties. In order to distinguish different materials of the layer, a calibration measurement may be carried out before the actual measurement.

In the case of such a calibration measurement, for example for different materials in each case with different thicknesses of the contaminating layer, it is possible to determine the wavelength shifts of the measurement radiation scattered at plasmonic nanoparticles having different properties in each case. The values obtained in this case may be stored in a table or list and, for a respective contaminating material, constitute in each case a characteristic signature which makes it possible to identify a respective contaminating material on the basis of the detected measurement radiation. Since only the refractive index of a respective contaminating material influences the wavelength shift, in general only contaminating materials which have a different refractive index can be distinguished in the manner described here.

In one development, the at least one different property is selected from the group comprising: size of the plasmonic nanoparticles, geometry of the plasmonic nanoparticles and material of the plasmonic nanoparticles. The sensitivity of the wavelength shift of plasmonic nanoparticles to changes in refractive index in the surroundings, i.e. in the present case different materials of the contaminating layer, depends inter alia on the geometry of the plasmonic nanoparticles, e.g. on the aspect ratio thereof. Rod-shaped plasmonic nanoparticles typically have the highest sensitivity to changes in refractive index in the surroundings, while plasmonic nanoparticles in the form of triangles or spheres generally have a lower sensitivity to changes in refractive index in the surroundings. The size of the plasmonic nanoparticles or the size distribution or the polydispersity of the plasmonic nanoparticles and the material thereof also influence the sensitivity to changes in refractive index in the surroundings, which, as described further above, can be used for identifying a contaminating material or for distinguishing a plurality of different contaminating materials.

In a further variant, the wavelength shift of the spectral distribution is determined on the basis of a shift in a maximum wavelength of the spectral distribution or on the basis of a change in the scattered light intensity at at least two measurement wavelengths of the spectral distribution. The detection of the measurement radiation scattered at the plasmonic nanoparticles is typically performed with the aid of a detector, which may have a spectrometer, for example, in order to record the spectral distribution of the scattered light intensity depending on the wavelength, that is to say that the scattered measurement radiation is detected over a typically continuous wavelength range predefined by the spectrometer.

Alternatively, the detector may be designed to detect the intensity of the scattered measurement radiation only at two or possibly at more than two generally fixedly predefined, discrete measurement wavelengths. These measurement wavelengths typically lie at the edge or at the edges of the spectral distribution of the scattered light intensity of the measurement radiation which is scattered by the plasmonic nanoparticles without a contaminating layer.

The intensity of the measurement radiation scattered at the plasmonic nanoparticles may be detected integrally over the surface, i.e. not in a spatially resolved manner. This is expedient for example if it can be assumed that the contaminating layer has a substantially homogeneous thickness or if location-dependent differences in the thickness of the contaminating layer do not have high relevance e.g. for cleaning the surface.

In one variant of the method, the measurement radiation scattered at the plasmonic nanoparticles is detected in a spatially resolved manner. In the spatially resolved detection, the spatial resolution may be chosen, if appropriate, with a magnitude such that the measurement radiation scattered at an individual plasmonic nanoparticle can be distinguished from the measurement radiation scattered at a directly adjacent plasmonic nanoparticle. This is not necessarily the case, however; i.e. it is possible for example to choose a spatial resolution for which only the measurement radiation scattered by a group of several or a multiplicity of plasmonic nanoparticles can respectively be distinguished from measurement radiation which is scattered at an adjacent group of plasmonic nanoparticles.

If appropriate, the spatial resolution may be varied. In this case, the detector may comprise for example a (zoom) optical unit which magnifies a specific region of the surface in order to increase the spatial resolution. In particular, the spatially resolved detection may serve to identify local differences in the thickness of the contaminating layer, for example by producing a map of the contaminating layer on the surface, in which different value ranges of the thickness of the contaminating layer or local differences in the wavelength shift of the spectral distribution of the measurement radiation are represented.

In a further variant, the plasmonic nanoparticles are formed on a surface of a capping layer of a coating of an optical element, which coating reflects EUV radiation. As was described further above, the plasmonic nanoparticles may be formed on a surface of a non-optical element or on a surface of an optical element e.g. in an EUV lithography system.

An optical element for an EUV lithography system, for example an EUV mirror, typically comprises a substrate, on which a reflective coating is applied. The type of reflective coating depends, inter alia, on the angle of incidence of the incident EUV radiation, wherein in general so-called normal incidence and grazing incidence of the EUV radiation are distinguished. In both cases, the reflective coating typically comprises a capping layer in order to protect the reflective coating against influences from the surroundings. The capping layer has a surface facing the surroundings on which contaminating materials may deposit.

In order to determine the thickness of a contaminating layer and/or the type of the contaminating material on the surface of the capping layer, the capping layer comprises plasmonic nanoparticles. The plasmonic nanoparticles are typically arranged in a grid arrangement (an array), i.e. regularly or periodically, but this is not absolutely necessary. The plasmonic nanoparticles may be formed on the surface for example in a self-assembling process, e.g. by means of so-called "nanosphere lithography" (NSL), which makes it possible to produce periodic array structures of (plasmonic) nanoparticles. The distance between adjacent plasmonic nanoparticles may be chosen to be larger or smaller, as required, wherein, when applying the nanoparticles to a reflective optical element, care should be taken to ensure that the density of the plasmonic nanoparticles on the surface does not exceed the permissible specification. The plasmonic nanoparticles should be prevented from being arranged next to one another so densely that they result in a reduction in the reflectivity and/or an impairment of the optical properties of the optical element.

In one development, the plasmonic nanoparticles are applied to the surface of the capping layer or are at least partly embedded into the capping layer. In the former case, the plasmonic nanoparticles project upward above the (not yet contaminated) capping layer; in the second case, the plasmonic nanoparticles are "buried" wholly or partly in the capping layer. In the second case, the plasmonic nanoparticles may, if appropriate, not be directly in contact with the surface. In this case, however, in general the sensitivity of the measurement to contaminating materials that have deposited on the surface decreases, particularly if a comparatively thick contaminating layer is present on the surface.

The embedding of the plasmonic nanoparticles into the capping layer may be carried out for example by means of a method in which firstly a part of the thickness of the capping layer is applied without nanoparticles. In a subsequent step, the plasmonic nanoparticles are applied to said part of the capping layer and the interspaces between the plasmonic nanoparticles are filled with additional nanoparticles which consist of the material of the capping layer. A particle layer having a substantially homogeneous thickness is produced in this way. A further part of the capping layer is applied to the (melted and thus homogeneous) particle layer, said further part consisting only of the material of the capping layer, until the desired thickness of the capping layer is reached. By introducing the material of the capping layer into the interspaces between the nanoparticles, it is possible to reduce the roughness of the capping layer. If appropriate, the nanoparticles may also be applied directly to the underlying layer, such that the first step of the method described above is omitted.

In a further variant of the method, at least the steps of irradiating and detecting are carried out during the operation of the optical system, in particular during the operation of the EUV lithography system, e.g. an EUV lithography apparatus. This is possible if the irradiation with the measurement radiation and the scattering of the measurement radiation at the plasmonic nanoparticles do not disturb the operation of the optical system. In general this is not the case if the surface on which the thickness of the contaminating layer and/or the type of the contaminating material are/is determined is a non-optical surface, i.e. is arranged outside the beam path of the optical system. By contrast, if the surface is arranged wholly or partly in the beam path of the optical system, then the measurement generally does not disturb the operation of the optical system if the measurement radiation has measurement wavelength(s) sufficiently remote from an operating wavelength of the optical system. This is typically the case if the optical system is an EUV lithography system which is operated at wavelengths in the EUV range of between approximately 5 nm and approximately 30 nm, while the measurement wavelengths of the measurement radiation typically lie in the visible wavelength range.

A further aspect of the invention relates to an optical element for reflecting EUV radiation, comprising: a substrate, a coating for reflecting EUV radiation, said coating being formed on the substrate, wherein the coating comprises a capping layer having a surface facing away from the substrate, and wherein plasmonic nanoparticles are formed on the surface of the capping layer. In general, during the operation of such an optical element in an EUV lithography system, a contaminating layer forms on the surface, the thickness of which contaminating layer and also the type of the contaminating material can be determined in the manner described further above in association with the method.

Reflective optical elements for EUV radiation may be operated with normal incidence, i.e. for angles of incidence of the EUV radiation of less than approximately 45° with respect to the surface normal of the surface, or with grazing incidence, i.e. for angles of incidence of the used radiation of more than approximately 60° with respect to the surface normal of the surface. The reflective optical element typically has a maximum of the reflectivity in the corresponding angle-of-incidence range (<45° or respectively >60°), which may be achieved by means of a suitably optimized reflective coating. The type of light incidence (grazing or normal) is only of secondary importance for the measurement described here. Reflective coatings optimized both for grazing and for normal incidence may be provided with a capping layer on which the plasmonic nanoparticles are formed. In the case of grazing incidence, the coating may, if appropriate, consist only of the capping layer on which the plasmonic nanoparticles are formed.

In one embodiment, the plasmonic nanoparticles are formed from a metallic material, in particular from Au, Ag or Cu. The three materials mentioned have a high absorption for measurement radiation in the visible wavelength range, such that nanoparticles composed of these materials can be excited to perform collective oscillations (plasmons), and generate scattered measurement radiation that can be detected and evaluated in the manner described further above in association with the method.

In a further embodiment, the plasmonic nanoparticles on the surface of the capping layer have a width that is smaller than the height of the plasmonic nanoparticles, or vice versa. In principle, localized surface plasmons may form on nanoparticles having different geometries, for example on rod-shaped or spherical nanoparticles, but such non-spherical plasmonic nanoparticles do not scatter isotropically. For the detection sensitivity it is advantageous if the nanoparticles, in the two-dimensional projection in which they are imaged on the detector, have an aspect ratio of between approximately 1.5 and 5, wherein the aspect ratio denotes the ratio between the length and the width of the two-dimensional region which is imaged on the detector and which corresponds to the plasmonic nanoparticle. Typically, in the case of rod-shaped plasmonic nanoparticles, it is therefore advantageous if the detector is positioned such that it is aligned with the longitudinal side, since the detector otherwise perceives the rod-shaped nanoparticle as a spherical nanoparticle, at which scattered measurement radiation is detected with lower sensitivity.

In a further embodiment, the plasmonic nanoparticles are arranged on the surface in a grid. Such an arrangement in a grid or in a periodic arrangement may be produced for example if the nanoparticles are produced by so-called "nanosphere lithography" (NSL). The resolution capability of the detector determines the spatial resolution when determining the thickness of the contaminating layer. The distances between adjacent nanoparticles of the grid should be chosen such that these can be detected in a spatially resolved manner by the detector, since otherwise only the detected signal strength increases. Typical distances between the plasmonic nanoparticles are more than approximately 0.1 mm, 1 mm or greater in the case of a detector having a conventional resolution capability. A distance of less than approximately 20 nm between adjacent nanoparticles should be avoided in order to avoid parasitic crosstalk.

In a further embodiment, plasmonic nanoparticles having at least one different property are arranged on the surface, said property preferably being selected from the group comprising: size of the plasmonic nanoparticles, geometry of the plasmonic nanoparticles and material of the plasmonic nanoparticles. As was described further above, given suitable calibration, the type of the contaminating material can be deduced by the use of plasmonic nanoparticles having different properties. In particular, in this case it is possible to use polydisperse nanoparticles, wherein the size of the nanoparticles, more precisely their diameter or, in the case of non-rotationally symmetrical nanoparticles, the maximum extent thereof is generally of the order of magnitude of between approximately 5 nm and approximately 100 nm.

A further aspect of the invention relates to an EUV lithography system, in particular an EUV lithography apparatus, comprising: at least one surface on which plasmonic nanoparticles are formed, at least one measurement radiation source for irradiating the surface on which the plasmonic nanoparticles are formed with measurement radiation, at least one detector for detecting the measurement radiation scattered at the plasmonic nanoparticles and an evaluation device for determining a thickness of a contaminating layer and/or the type of the contaminating material of the contaminating layer on the surface on the basis of the detected measurement radiation.

As was described further above, with the aid of the measurement radiation source, the detector and the evaluation device, it is possible to measure the thickness of the contaminating layer and, if appropriate, the type of the contaminating material in situ and in operando, i.e. during the operation of the EUV lithography system. For this purpose, the evaluation device may be designed for carrying out the steps described further above in association with the evaluation of the measurement radiation.

Within the meaning of this application, a contaminating layer is not necessarily understood to mean a layer extending continuously over the entire surface; rather, a contaminating layer may be composed of a plurality of non-continuous contaminated partial regions on the surface, wherein the thickness of a respective partial region may be determined by the plasmonic nanoparticles formed in the respective partial region on the surface.

In a further embodiment, the surface on which the plasmonic nanoparticles are formed is the surface of the capping layer of an optical element for reflecting EUV radiation, which optical element is embodied as described further above. Alternatively, the surface on which the plasmonic nanoparticles are formed may also be a non-optical surface, i.e. the surface of a component which is not arranged in the beam path of the EUV radiation.

In a further embodiment, the detector is designed for the preferably spatially resolved detection of a spectral distribution of the measurement radiation. For this purpose, the detector may comprise a spectrometer, for example, by means of which the scattered light intensity can be measured continuously over a wavelength range of interest. If appropriate, the detector may be designed only for detecting measurement radiation at two or, if appropriate, more than two discrete measurement wavelengths.

In a further embodiment, the measurement radiation source is designed for generating measurement radiation in the visible wavelength range. The use of measurement radiation in the visible wavelength range, i.e. between approximately 380 nm and 750 nm, is advantageous since that is where the absorption bands of most metallic materials lie which can be excited to carry out collective oscillations in the form of plasmons. A broadband measurement radiation source may serve for generating the measurement radiation or for illuminating the plasmonic nanoparticles, which source emits for example measurement radiation at measurement wavelengths of the entire visible spectrum (white light source). In the simplest case, it is possible to use a measurement radiation source which emits measurement radiation for irradiating the plasmonic nanoparticles only in a narrow band of measurement wavelengths, if the resonance wavelength of the plasmonic nanoparticles lies in this wavelength band.

Further features and advantages of the invention are evident from the following description of exemplary embodiments of the invention, with reference to the figures of the drawing, which show details essential to the invention, and from the claims. The individual features may be realized in each case individually by themselves or as a plurality in any desired combination in a variant of the invention.

DRAWING

Exemplary embodiments are illustrated in the schematic drawing and are explained in the following description. In the figures.

In the following description of the drawings, identical reference signs are used for identical or functionally identical components.

Figure 1:
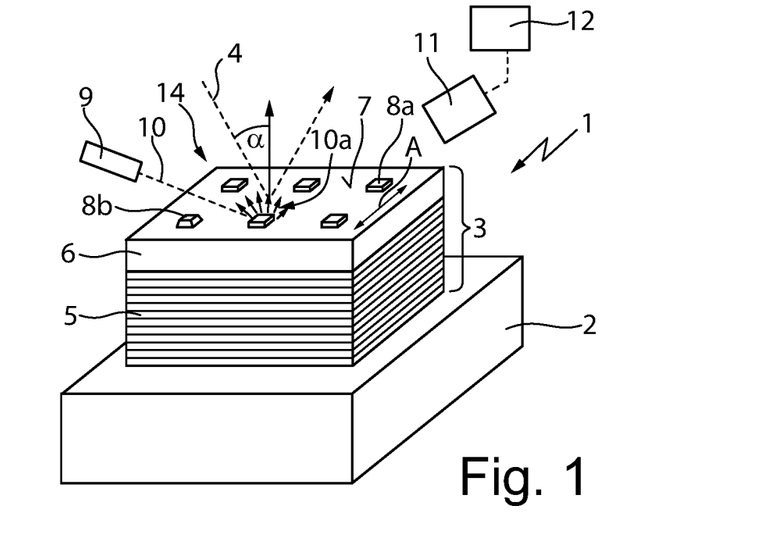
FIG. 1 shows a schematic illustration of an optical element for reflecting EUV radiation having a surface on which plasmonic nanoparticles are formed, FIGS. 2a,b show schematic illustrations of spectral distributions of measurement radiation scattered at plasmonic nanoparticles.

FIG. 1 schematically shows an optical element 1 in the form of an EUV mirror. The optical element 1 comprises a substrate 2, to which a coating 3 is applied, which is designed for reflecting EUV radiation 4 in the example shown. The optical element 1 shown in FIG. 1 is designed for reflecting EUV radiation 4 that is incident on the surface 7 of the capping layer 6 with normal incidence. The angles α of incidence at which the EUV radiation 4 impinges on the optical element 1 are in this case typically less than approximately 45°. In order to optimize the optical element 1 for normal incidence, in the case of the coating 3 shown in FIG. 1, a multilayer coating 5 having a high reflectivity for the EUV radiation 4 is applied below the capping layer 6.

For this purpose, the multilayer coating 5 typically comprises alternating layers of a high refractive index material and a low refractive index material. The materials of the high and low refractive index layers of the multilayer coating 5 depend on the wavelength of the EUV radiation 4 that is intended to be reflected at the optical element 1. At a wavelength of approximately 13.5 nm, the multilayer coating 5 typically comprises alternating layers of silicon and molybdenum. The capping layer 6 may be formed for example from rhodium, ruthenium or some other material which protects the underlying multilayer coating 5 against influences from the environment.

As an alternative to the reflective coating 3 optimized for normal incidence as shown in FIG. 1, the optical element 1 may also be optimized for reflecting EUV radiation 4 incident with grazing incidence, i.e. for EUV radiation 4 that is incident on the surface 7 at angles α of incidence of more than approximately 60° with respect to the surface normal. In this case, instead of the multilayer coating 5 shown in FIG. 1, if appropriate just one individual reflective layer may be present in the coating 3, which is typically formed from a material having a low refractive index and a low absorption for the EUV radiation 4 incident with grazing incidence, in particular from a metallic material, e.g. Ru, Mo or Nb. The design of the optical element 1 for reflecting EUV radiation 4 incident with normal incidence or with grazing incidence is of secondary importance for the contamination effects under consideration here.

In the case of the optical element 1 shown in FIG. 1, plasmonic nanoparticles 8a, 8b are formed on the surface 7 of the capping layer 6. The nanoparticles 8a,b consist of a material which, upon irradiation with measurement radiation 10 from a measurement radiation source 9, for example in the form of a white light source, results in said nanoparticles being excited to carry out collective oscillations in the form of (localized) plasmons. The plasmonic nanoparticles 8a,b may be formed for example from a metallic material, such as Au, Ag or Cu, the absorption bands of which lie in the visible wavelength range, such that these can be excited with the aid of the measurement radiation 10 that likewise lies in the visible wavelength range.

In the example shown in FIG. 1, the measurement radiation 10a scattered at the plasmonic nanoparticles 8a,b is detected with the aid of a detector 11. An evaluation device 12 is connected to the detector 11 in order to evaluate the detected measurement radiation 10a scattered at the plasmonic nanoparticles 8a,b.

Figure 2A:
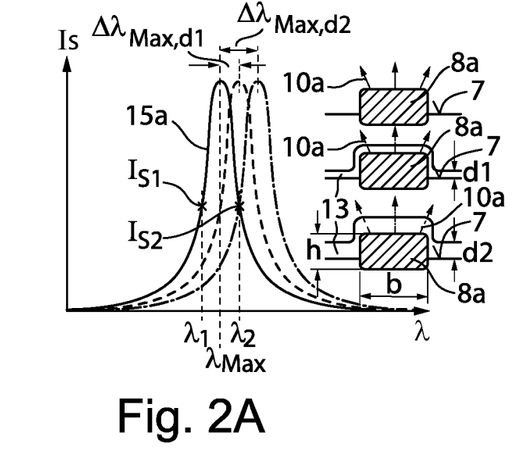

FIG. 2a shows the scattered light intensity Is, which is detected in a spatially resolved manner by the detector 11 in the example shown, as a function of the wavelength λ. For the wavelength-dependent detection of the scattered measurement radiation 10a, the detector 11 typically comprises a spectrometer. In the example shown, the detector 11 has a spatial resolution having a magnitude such that the measurement radiation 10a scattered only by one individual nanoparticle of the plasmonic nanoparticles 8a shown in FIG. 1 can be detected. The spectral distribution 15a of the measurement radiation 10a scattered at said plasmonic nanoparticle 8a is illustrated for three different cases in FIG. 2a:

The spectral distribution 15a illustrated on the left in FIG. 2a corresponds to the case shown in FIG. 1 in which the surface 7 of the capping layer 6 is free of contaminations. As can be discerned in FIG. 2a, the spectral distribution 15a and thus also the maximum wavelength $\lambda_{Max}$ thereof shifts to higher wavelengths λ if a contaminating layer 13 shown in FIG. 2a forms on the surface 7.

As can likewise be discerned in FIG. 2a, the contaminating layer 13 produces a first wavelength shift $\Delta\lambda_{Max,d1}$ in the case of a first thickness $d_1$ and a second wavelength shift $\Delta\lambda_{Max,d2}$, which is greater than the first wavelength shift $\Delta\lambda_{Max,d1}$, in the case of a second, larger thickness $d_2$. The absolute value of the wavelength shift $\Delta\lambda_{Max}$ is thus a measure of the respective thickness d1, d2 of the contaminating layer 13. On the basis of a calibration measurement carried out beforehand it is possible—given known material of the contaminating layer 13—to assign a specific thickness d1, d2 of the contaminating layer 13 to a wavelength shift $\Delta\lambda_{Max}$.

As is shown in FIG. 2a, the wavelength shift $\Delta\lambda_{Max}$ can also be determined not by recording the entire spectral distribution 15a of the scattered measurement radiation 10a depending on the wavelength λ by means of the detector 11, but rather by determining a (first and second) scattered light intensity $I_{s1}$, $I_{s2}$ only for two fixedly predefined measurement wavelengths $\lambda_1$, $\lambda_2$. The first measurement wavelength $\lambda_1$ is formed on the left-hand edge and the second measurement wavelength $\lambda_2$ on the right-hand edge of the spectral distribution 15a. Given a sufficiently large spacing of the measurement wavelengths $\lambda_1$, $\lambda_2$ from the centre of the spectral distribution 15a and given a sufficiently small wavelength shift $\Delta\lambda_{Max}$ to greater wavelengths $\lambda$, the first scattered light intensity $I_{s1}$ decreases, while the second scattered light intensity $I_{s2}$ increases, such that on the basis of the difference between the two scattered light intensities $I_{s1}$, $I_{s2}$, for example on the basis of the difference $I_{s1}-I_{s2}$ or on the basis of the quotient $I_{s1}/I_{s2}$ it is possible to deduce the absolute value of the wavelength shift $\Delta\lambda_{Max}$ and thus the thickness d1, d2 of the contaminating layer 13.

The nanoparticles 8a,b formed on the surface 7 typically have a geometry or a suitable aspect ratio adapted for generating plasmons. As can be discerned in FIG. 2a, the (maximum) lateral width b of the nanoparticles 8a,b is typically greater than the height h of the nanoparticles 8a,b, wherein a typical order of magnitude for the height h is between approximately 5 nm and approximately 30 nm and wherein a typical order of magnitude for the width b is between approximately 5 nm and approximately 100 nm.

As can likewise be discerned in FIG. 1, the plasmonic nanoparticles 8a,b are arranged on the surface 7 in a regular arrangement or in a grid 14, that is to say that the midpoints of adjacent plasmonic nanoparticles 8a,b are at regular distances A from one another, which may be for example of the order of magnitude of a number of millimetres. The distance A between adjacent nanostructures 8a,b should not be chosen to be too small, in order that it is possible to comply with the specification of the optical element 1 with regard to reflectivity and, if appropriate, with regard to imaging aberrations. In order to avoid a parasitic crosstalk between adjacent plasmonic nanoparticles 8a,b, the distance A should typically be greater than approximately 20 nm.

The plasmonic nanoparticles 8a,b may be formed on the surface 7 for example with the aid of so-called "nanosphere lithography" (NSL), which fosters the production of periodic arrays or grids 14 of plasmonic nanoparticles 8a,b. In this case, as is shown in FIG. 1, the nanoparticles 8a,b may be applied to the surface 7 of the capping layer 6 or be wholly or partly embedded into the capping layer 6, as is indicated by way of example in FIG. 2a. The deeper the plasmonic nanoparticles 8a,b are buried into the capping layer 6, the lower, however, typically the sensitivity of the scattered light measurement described further above, that is to say that the resolution in determining the thickness d1, d2 of the contaminating layer 13 typically decreases.

Different types of plasmonic nanoparticles 8a,b may be arranged on the surface 7. By way of example, FIG. 1 shows a (second) plasmonic nanoparticle 8b, which differs by its irregular geometry from the substantially parallelepipedal geometry of the other (first) plasmonic nanoparticle 8a on the surface 7 of the optical element 1. It goes without saying that more than just one plasmonic nanoparticle 8b having an irregular geometry may be arranged on the surface 7 shown in FIG. 1; by way of example, every second one of the nanoparticles 8a,b may have an irregular geometry.

Figure 2B:
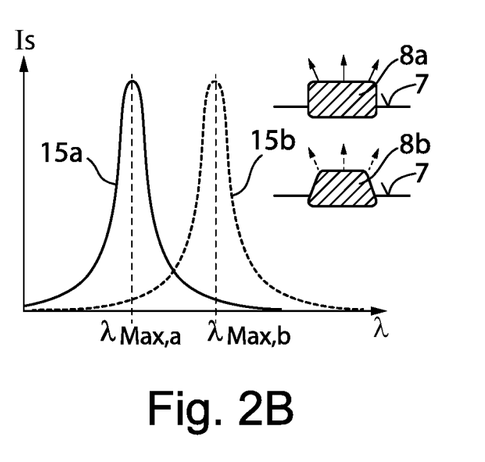

As in FIG. 2a, FIG. 2b also shows the spectral distribution 15a of the scattered light intensity $I_s$ of the measurement radiation 10a scattered at the parallelepipedal nanoparticle 8a from FIG. 1. In addition, FIG. 2b also illustrates the spectral distribution 15b of the measurement radiation 10a scattered at the plasmonic nanoparticle 8b having the irregular geometry. As can be discerned in FIG. 2b, the maximum wavelength $\lambda_{Max,a}$ of the spectral distribution 15a of the measurement radiation 10a scattered at the first parallelepipedal nanoparticle 8a differs from the maximum wavelength $\lambda_{Max,b}$ of the measurement radiation 10a scattered at the second parallelepipedal nanoparticle 8b.

Particularly if the scattered measurement radiation 10a that is detected by the detector 11 does not originate from an individual nanoparticle 8a, 8b but rather from a plurality of (first and second) nanoparticles 8a, 8b, it is advantageous if the maximum wavelengths $\lambda_{Max,a}$, $\lambda_{Max,b}$ of the two spectral distributions 15a, 15b are sufficiently far apart that these can be separated spectrally well during the evaluation in the evaluation device 12, since in this case the sum of the two spectral distributions 15a, 15b shown in FIG. 2b is detected as scattered light intensity $I_s$.

In addition to the different maximum wavelengths $\lambda_{Max,a}$, $\lambda_{Max,b}$ of the two spectral distributions 15a, 15b, the absolute value of the wavelength shift $\Delta\lambda_{Max,a}$, $\Delta\lambda_{Max,b}$ (given an identical or constant thickness of the contaminating layer 13) of the two spectral distributions 15a, 15b also differs depending on the type of the material of the contaminating layer 13, to put it more precisely depending on the refractive index of said material. If, for a plurality of different thicknesses d1, d2 of a contaminating layer 13 composed of a known material, the respective wavelength shift $\Delta\lambda_{Max,a}$, $\Delta\lambda_{Max,b}$ is determined and stored in a list or table, these values form a type of signature for a respective contaminating material of the layer 13.

If the respective wavelength shift $\Delta\lambda_{Max,a}$, $\Delta\lambda_{Max,b}$ is determined during a measurement with the aid of the evaluation device 12, in addition to the thickness d1, d2 of the contaminating layer 13 by means of a comparison with the known values of the wavelength shifts $\Delta\lambda_{Max,a}$, $\Delta\lambda_{Max,b}$ stored for different materials in the table, it is possible to determine the material of the contaminating layer 13.

It goes without saying that for distinguishing a multiplicity of different materials of the contaminating layer 13, it is possible to arrange on the surface 7 not just the plasmonic nanoparticles 8a,b having two different geometries as shown in FIG. 1, but also plasmonic nanoparticles having a third, fourth, . . . geometry, which differ respectively from the first, second, . . . geometry. Generally it is advantageous to arrange on the surface 7 plasmonic nanoparticles 8a,b which differ from one another in at least one property which enables or fosters the distinguishing of different materials of the contaminating layer 13. Besides a different geometry of the plasmonic nanoparticles 8a,b, the property may be for example the size of the nanoparticles 8a,b, that is to say that the size of the plasmonic nanoparticles 8a,b on the surface 7 may vary. The material of the plasmonic nanoparticles 8a,b on the surface 7 may also be chosen differently in order to be able to determine the type of the contaminating material of the layer 13 or identify or distinguish a multiplicity of different materials.

In FIG. 1, by way of example, the measurement radiation 10 emerging from the measurement radiation source 9 impinges only on exactly one plasmonic nanoparticle 8a. It goes without saying, however, that the measurement radiation source 9 may be designed to irradiate a larger region or the entire surface 7 of the capping layer with the measurement radiation 10. In this case, the measurement radiation 10a scattered at the irradiated plasmonic nanoparticles 8a,b may be detected in a spatially resolved manner by the detector 11, wherein the spatial resolution of the detector 11 may be set, if appropriate, e.g. with the aid of a zoom optical unit. By means of the zoom optical unit, it is possible, if appropriate, to represent specific partial regions of the surface 7 with higher spatial resolution or magnification, wherein, if appropriate, it is possible to achieve a spatial resolution for which only the measurement radiation 10*a* scattered at an individual plasmonic nanoparticle 8*a* is detected by the detector 11, as is illustrated in FIG. 1.

Figure 3:
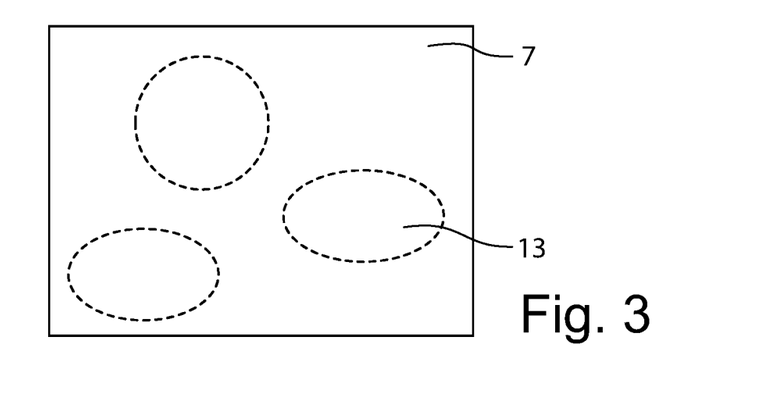
FIG. 3 shows a schematic illustration of a map of contaminations on the surface of the optical element.

The detection of the scattered measurement radiation 10*a* with the aid of a spatially resolving detector 11 makes it possible to create a map of the contaminations on the surface 7, as is shown by way of example in FIG. 3: at the three partial regions illustrated in a dashed manner in FIG. 3, the wavelength shift $\Delta\lambda_{Max}$ determined in the manner described further above and thus the thickness d1 of the contaminating layer 13 lie above a predefined threshold value, while no contaminating material or only contaminating material having a very small thickness is present outside the partial regions shown in FIG. 3. It goes without saying that, by defining a plurality of threshold values of the wavelength shift $\Delta\lambda_{Max}$ it is possible to create a more detailed spatially resolved map of the contaminating layer 13 on the surface 7 of the optical element 1, in which a plurality of thickness intervals can be distinguished.

Instead of a spatially resolving detector 11, it is also possible to use a non-spatially resolving detector if the intention is to determine only information regarding the thickness of the contaminating layer 13, which information is integrated over the entire surface 7. If appropriate, the spatially resolving or non-spatially resolving detector 11 may also be moved, for example displaced, relative to the surface 7 in order to determine the thickness d1, d2 of the contaminating layer 13 at different locations of the surface 7. Correspondingly, if appropriate, it is also possible to move the measurement radiation source 9 relative to the surface 7 in order to illuminate different partial regions of the surface 7.

Figure 4:
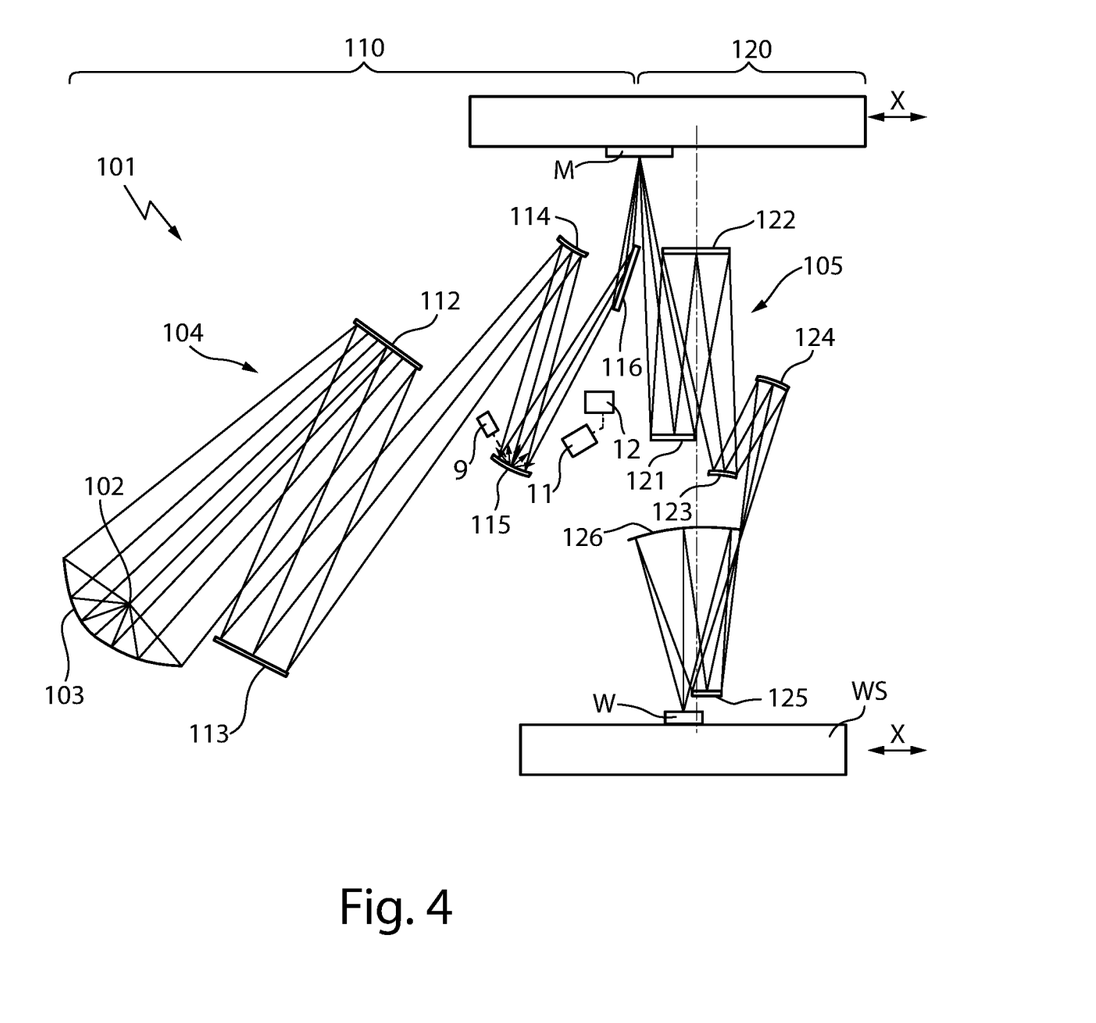
FIG. 4 shows a schematic illustration of an EUV lithography apparatus comprising an optical element embodied as in FIG. 1.

The optical element 1 in accordance with FIG. 1 may be integrated for example in an optical system in the form of an EUV lithography apparatus 101, which is illustrated highly schematically in FIG. 4. The EUV lithography apparatus 101 has an EUV light source 102 for generating EUV radiation, which has a high energy density in an EUV wavelength range below 50 nm, in particular between about 5 nm and about 15 nm. The EUV light source 102 may for example take the form of a plasma light source for generating a laser-induced plasma or be formed as a synchrotron radiation source. Particularly in the former case, as shown in FIG. 4, a collector mirror 103 can be used to focus the EUV radiation of the EUV light source 102 to form an illumination beam 104 and to increase the energy density further in this way. The illumination beam 104 serves for the illumination of a structured object M by means of an illumination system 110, which in the present example has five reflective optical elements 112 to 116 (mirrors).

The structured object M may be for example a reflective mask, which has reflective and non-reflective, or at least much less reflective, regions for producing at least one structure on the object M. Alternatively, the structured object M may be a plurality of micro-mirrors, which are arranged in a one-dimensional or multi-dimensional arrangement and which are possibly movable about at least one axis, in order to set the angle of incidence of the EUV radiation 104 on the respective mirror.

The structured object M reflects a part of the illumination beam 104 and forms a projection beam path 105 that carries the information about the structure of the structured object M and that is radiated into a projection system 120, which generates an imaging of the structured object M or of a respective partial region thereof on a substrate W. The substrate W, for example a wafer, comprises a semiconductor material, e.g. silicon, and also a light-sensitive layer, e.g. a photoresist, and is arranged on a mount, which is also referred to as a wafer stage WS.

In the present example, the projection system 120 comprises six reflective optical elements 121 to 126 (mirrors) in order to generate an image of the structure present on the structured object M on the wafer W. The number of mirrors in a projection system 120 typically lies between four and eight; however, only two mirrors may also possibly be used.

In the case of the EUV lithography apparatus 101 shown in FIG. 4, the arrangement comprising the measurement radiation source 9, the detector 11 and the evaluation device 12 as shown in FIG. 1 is shown by way of example on an optical element 115 of the illumination system 110. It goes without saying that any other optical element 112 to 114, 116 of the illumination system 110 or an optical element 121 to 126 of the projection system 120 may also be provided with a corresponding arrangement in order to determine the thickness of a contaminating layer and, if appropriate, the type of the contaminating material.

As an alternative or in addition to a surface 7 of an optical element 1, a surface of a non-optical element in the EUV lithography apparatus 101 may also be measured with regard to contaminations in the manner described further above.

Instead of a surface arranged in the EUV lithography apparatus 101, a surface arranged in a different optical system may also be measured with regard to contaminations in the manner described further above.

The invention claimed is:

1. Method for determining the thickness (d1, d2) of a contaminating layer (13) and/or the type of a contaminating material on a surface (7) in an optical system, comprising:
    irradiating the surface (7) on which plasmonic nanoparticles (8*a,b*) are formed with measurement radiation (10),
    detecting the measurement radiation (10*a*) scattered at the plasmonic nanoparticles (8*a,b*),
    determining wavelength shifts ($\Delta\lambda_{max,a}$, $\Delta\lambda_{max,b}$) of a plurality of spectral distributions (15*a*, 15*b*) of the measurement radiation (10*a*) scattered at the plasmonic nanoparticles (8*a*, 8*b*) having in each case at least one different property, the wavelength shifts ($\Delta\lambda_{max,a}$, $\Delta\lambda_{max,b}$) being dependent on the refractive index of the contaminating material;
    determining the type of the contaminating material on the basis of the refractive index of the contaminating material; and
    cleaning the surface with a reagent that is chosen based upon the type of the contaminating material.

2. Method according to claim 1, further comprising determining the thickness (d1, d2) of the contaminating layer (13) on the basis of the detected measurement radiation (10*a*).

3. Method according to claim 2, wherein a thickness-dependent wavelength shift ($\Delta\lambda_{max,d1}$, $\Delta\lambda_{max,d2}$) of the spectral distribution (15*a*) of the measurement radiation (10*a*) scattered at the plasmonic nanoparticles (8*a,b*) is determined for the purpose of determining the thickness (d1, d2) of the contaminating layer (13).

4. Method according to claim 3, wherein the wavelength shift ($\Delta\lambda_{max}$) of the spectral distribution (15*a*) is determined on the basis of a shift in a maximum wavelength ($\lambda_{max}$) of the spectral distribution (15*a*) or on the basis of a change in the scattered light intensity ($I_{s1}$, $I_{s2}$) at at least two measurement wavelengths ($\lambda_1$, $\lambda_2$) of the spectral distribution (15*a*).

5. Method according to claim 1, wherein the at least one different property is selected from the group comprising: geometry of the plasmonic nanoparticles (8*a,b*) and material of the plasmonic nanoparticles (8*a,b*).

6. Method according to claim 1, wherein the measurement radiation (10a) scattered at the plasmonic nanoparticles (8a,b) is detected in a spatially resolved manner.

7. Method according to claim 1, wherein the plasmonic nanoparticles (8a,b) are formed on a surface (7) of a capping layer (6) of a coating (3) of an optical element (1), which coating reflects Extreme Ultraviolet (EUV) radiation (4).

8. Method according to claim 7, wherein the plasmonic nanoparticles (8a,b) are applied to the surface (7) of the capping layer (6) or are at least partly embedded into the capping layer (6).

9. Method according to claim 1, wherein at least the steps of irradiating and detecting are carried out during the operation of the optical system.

10. Extreme Ultraviolet (EUV) lithography system (101), comprising:
- at least one surface (7) on which plasmonic nanoparticles (8a,b) are formed,
- at least one measurement radiation source (9) for irradiating the surface (7) on which the plasmonic nanoparticles (8) are formed with measurement radiation (10),
- at least one detector (11) for detecting the measurement radiation (10a) scattered at the plasmonic nanoparticles (8a,b) and
- an evaluation device (12) configured for determining the type of a contaminating material on the surface (7) on the basis of a refractive index of the contaminating material, wherein the evaluation device determines wavelength shifts ($\Delta\lambda_{max,a}$, $\Delta\lambda_{max,b}$) of a plurality of spectral distributions (15a, 15b) of the measurement radiation (10a) scattered at the plasmonic nanoparticles (8a, 8b) having in each case at least one different property, the wavelength shifts ($\Delta\lambda_{max,a}$, $\Delta\lambda_{max,b}$) being dependent on the refractive index of the contaminating material.

11. EUV lithography system according to claim 10, wherein the surface (7) on which the plasmonic nanoparticles (8a,b) are formed forms the surface (7) of the capping layer (6) of an optical element (1).

12. EUV lithography system according to either of claims 10 and 11, wherein the detector (12) is designed for the detection of the spectral distribution of the measurement radiation (10a).

13. EUV lithography system according to claim 10, wherein the measurement radiation source (9) is designed for generating measurement radiation (10) in the visible wavelength range.

14. EUV lithography system according to claim 10, wherein the evaluation device is further configured for determining the thickness (d1, d2) of a contaminating layer (13) on the basis of the detected measurement radiation (10a).

* * * * *

UNITED STATES PATENT AND TRADEMARK OFFICE
CERTIFICATE OF CORRECTION

PATENT NO. : 10,627,217 B2
APPLICATION NO. : 15/485870
DATED : April 21, 2020
INVENTOR(S) : Irene Ament et al.

Page 1 of 1

It is certified that error appears in the above-identified patent and that said Letters Patent is hereby corrected as shown below:

In the Specification

Column 3, Line 13, Delete "adsorped" and insert -- adsorbed --, therefor.

Column 3, Line 61, Delete "nanoparticles:" and insert -- nanoparticles. --, therefor.

Column 10, Line 29, Delete "Is," and insert -- $I_s$, --, therefor.

Column 10, Line 41, Delete "2a:" and insert -- 2a. --, therefor.

Signed and Sealed this
Third Day of November, 2020

Andrei Iancu
*Director of the United States Patent and Trademark Office*